United States Patent
Jeddeloh et al.

(10) Patent No.: US 7,529,896 B2
(45) Date of Patent: *May 5, 2009

(54) MEMORY MODULES HAVING A MEMORY HUB CONTAINING A POSTED WRITE BUFFER, A MEMORY DEVICE INTERFACE AND A LINK INTERFACE, AND METHOD OF POSTING WRITE REQUESTS IN MEMORY MODULES

(75) Inventors: Joseph M. Jeddeloh, Shoreview, MN (US); Terry R. Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 106 days.

This patent is subject to a terminal disclaimer.

(21) Appl. No.: 11/433,201

(22) Filed: May 11, 2006

(65) Prior Publication Data

US 2006/0212655 A1 Sep. 21, 2006

Related U.S. Application Data

(63) Continuation of application No. 10/601,253, filed on Jun. 20, 2003, now Pat. No. 7,107,415.

(51) Int. Cl.
*G06F 13/00* (2006.01)
*G06F 3/00* (2006.01)

(52) U.S. Cl. ............... 711/154; 711/158; 711/168; 711/170; 711/105; 710/52; 710/36

(58) Field of Classification Search ............ 711/154, 711/158, 168, 170, 105; 710/52, 36
See application file for complete search history.

(56) References Cited

U.S. PATENT DOCUMENTS 3,742,253 A 6/1973 Kronies ............... 307/247

(Continued)

FOREIGN PATENT DOCUMENTS

EP 0849685 A2 6/1998

(Continued)

OTHER PUBLICATIONS

"Free On-Line Dictionary of Computing" entry Flash Erasable Programmable Read-Only Memory, online May 17, 2004 [http://foldoc.doc.ic.ac.uk/foldoc/foldoc.cgi?flash+memory].

(Continued)

*Primary Examiner*—Hong Kim
(74) *Attorney, Agent, or Firm*—Dorsey & Whitney LLP (57) ABSTRACT

A memory module includes a memory hub coupled to several memory devices. The memory hub includes a posted write buffer that stores write requests so that subsequently issued read requests can first be coupled to the memory devices. The write request addresses are also posted in the buffer and compared to subsequent read request addresses. In the event of a positive comparison indicating that a read request is directed to an address to which an earlier write request was directed, the read data are provided from the buffer. When the memory devices are not busy servicing read request, the write requests can be transferred from the posted write buffer to the memory devices. The write requests may also be accumulated in the posted write buffer until either a predetermined number of write requests have been accumulated or the write requests have been posted for a predetermined duration.

10 Claims, 3 Drawing Sheets

U.S. PATENT DOCUMENTS

| | | | |
|---|---|---|---|
| 4,045,781 A | 8/1977 | Levy et al. | 364/200 |
| 4,240,143 A | 12/1980 | Besemer et al. | 364/200 |
| 4,245,306 A | 1/1981 | Besemer et al. | 364/200 |
| 4,253,144 A | 2/1981 | Bellamy et al. | 364/200 |
| 4,253,146 A | 2/1981 | Bellamy et al. | 364/200 |
| 4,707,823 A | 11/1987 | Holdren et al. | 370/1 |
| 4,724,520 A | 2/1988 | Athanas et al. | 364/200 |
| 4,831,520 A | 5/1989 | Rubinfeld et al. | 364/200 |
| 4,930,128 A | 5/1990 | Suzuki et al. | 371/12 |
| 4,953,930 A | 9/1990 | Ramsey et al. | 350/96.11 |
| 5,133,059 A | 7/1992 | Ziegler et al. | 395/425 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,313,590 A | 5/1994 | Taylor | 395/325 |
| 5,317,752 A | 5/1994 | Jewett et al. | 395/750 |
| 5,319,755 A | 6/1994 | Farmwald et al. | 395/325 |
| 5,355,391 A | 10/1994 | Horowitz et al. | 375/36 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,497,476 A | 3/1996 | Oldfield et al. | 395/439 |
| 5,502,621 A | 3/1996 | Schumacher et al. | 361/760 |
| 5,544,319 A | 8/1996 | Acton et al. | 395/200.07 |
| 5,566,325 A | 10/1996 | Bruce, II et al. | 395/494 |
| 5,577,220 A | 11/1996 | Combs et al. | 395/416 |
| 5,581,767 A | 12/1996 | Katsuki et al. | 395/800 |
| 5,606,717 A | 2/1997 | Farmwald et al. | 395/856 |
| 5,638,334 A | 6/1997 | Farmwald et al. | 365/230.03 |
| 5,638,534 A | 6/1997 | Mote, Jr. | 395/485 |
| 5,659,713 A | 8/1997 | Goodwin et al. | 395/484 |
| 5,659,798 A | 8/1997 | Blumrich et al. | 395/846 |
| 5,687,325 A | 11/1997 | Chang | 395/284 |
| 5,706,224 A | 1/1998 | Srinivasan et al. | 365/49 |
| 5,710,733 A | 1/1998 | Chengson et al. | 365/52 |
| 5,715,456 A | 2/1998 | Bennett et al. | 395/652 |
| 5,729,709 A | 3/1998 | Harness | 395/405 |
| 5,796,413 A | 8/1998 | Shipp et al. | 345/522 |
| 5,818,844 A | 10/1998 | Singh et al. | 370/463 |
| 5,819,304 A | 10/1998 | Nilsen et al. | 711/5 |
| 5,822,255 A | 10/1998 | Uchida | 365/194 |
| 5,832,250 A | 11/1998 | Whittaker | 395/471 |
| 5,838,931 A | 11/1998 | Regenold et al. | 395/308 |
| 5,875,352 A | 2/1999 | Gentry et al. | 395/843 |
| 5,875,454 A | 2/1999 | Craft et al. | 711/113 |
| 5,887,159 A | 3/1999 | Burrows | 395/567 |
| 5,928,343 A | 7/1999 | Farmwald et al. | 710/104 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,006,340 A | 12/1999 | O'Connell | 713/600 |
| 6,011,741 A | 1/2000 | Wallace et al. | 365/221 |
| 6,023,726 A | 2/2000 | Saksena | 709/219 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,038,630 A | 3/2000 | Foster et al. | 710/132 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,067,649 A | 5/2000 | Goodwin | 714/718 |
| 6,073,190 A | 6/2000 | Rooney | 710/56 |
| 6,076,139 A | 6/2000 | Welker et al. | 711/104 |
| 6,079,008 A | 6/2000 | Clery, III | 712/11 |
| 6,092,158 A | 7/2000 | Harriman et al. | 711/151 |
| 6,098,158 A | 8/2000 | Lay et al. | 711/162 |
| 6,105,075 A | 8/2000 | Ghaffari | 710/5 |
| 6,125,431 A | 9/2000 | Kobayashi | 711/154 |
| 6,128,703 A | 10/2000 | Bourekas et al. | 711/138 |
| 6,128,706 A | 10/2000 | Bryg et al. | 711/141 |
| 6,134,624 A | 10/2000 | Burns et al. | 710/131 |
| 6,137,709 A | 10/2000 | Boaz et al. | 365/51 |
| 6,144,587 A | 11/2000 | Yoshida | 365/189.05 |
| 6,145,033 A | 11/2000 | Chee | 710/57 |
| 6,157,743 A | 12/2000 | Goris et al. | 382/233 |
| 6,157,962 A | 12/2000 | Hodges et al. | 710/1 |
| 6,167,465 A | 12/2000 | Parvin et al. | 710/22 |
| 6,167,486 A | 12/2000 | Lee et al. | 711/120 |
| 6,175,571 B1 | 1/2001 | Haddock et al. | 370/423 |
| 6,185,352 B1 | 2/2001 | Hurley | 385/114 |
| 6,185,676 B1 | 2/2001 | Poplingher et al. | 712/239 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,212,590 B1 | 4/2001 | Melo et al. | 710/119 |
| 6,223,301 B1 | 4/2001 | Santeler et al. | 714/6 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,252,821 B1 | 6/2001 | Nizar et al. | 365/238.6 |
| 6,256,692 B1 | 7/2001 | Yoda et al. | 710/104 |
| 6,272,609 B1 | 8/2001 | Jeddeloh | 711/169 |
| 6,285,349 B1 | 9/2001 | Smith | 345/147 |
| 6,286,083 B1 | 9/2001 | Chin et al. | 711/151 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,347,055 B1 | 2/2002 | Motomura | 365/189.05 |
| 6,349,363 B2 | 2/2002 | Cai et al. | 711/129 |
| 6,356,573 B1 | 3/2002 | Jonsson et al. | 372/46 |
| 6,367,074 B1 | 4/2002 | Bates et al. | 717/11 |
| 6,370,068 B2 | 4/2002 | Rhee | 365/196 |
| 6,370,611 B1 | 4/2002 | Callison et al. | 711/105 |
| 6,373,777 B1 | 4/2002 | Suzuki | 365/230.03 |
| 6,381,190 B1 | 4/2002 | Shinkai | 365/230.03 |
| 6,389,514 B1 | 5/2002 | Rokicki | 711/136 |
| 6,392,653 B1 | 5/2002 | Malandain et al. | 345/501 |
| 6,401,213 B1 | 6/2002 | Jeddeloh | 713/401 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,433,785 B1 | 8/2002 | Garcia et al. | 345/531 |
| 6,434,639 B1 | 8/2002 | Haghighi | 710/39 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,449,308 B1 | 9/2002 | Knight, Jr. et al. | 375/212 |
| 6,453,393 B1 | 9/2002 | Holman et al. | 711/154 |
| 6,457,116 B1 | 9/2002 | Mirsky et al. | 712/16 |
| 6,460,108 B1 | 10/2002 | McCoskey et al. | 710/310 |
| 6,460,114 B1 | 10/2002 | Jeddeloh | 711/120 |
| 6,462,978 B2 | 10/2002 | Shibata et al. | 365/63 |
| 6,463,059 B1 | 10/2002 | Movshovich et al. | 370/389 |
| 6,467,013 B1 | 10/2002 | Nizar | 711/1 |
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |
| 6,487,556 B1 | 11/2002 | Downs et al. | 707/101 |
| 6,487,628 B1 | 11/2002 | Duong et al. | 710/313 |
| 6,490,188 B2 | 12/2002 | Nuxoll et al. | 365/63 |

| Patent No. | Date | Inventor | Class |
|---|---|---|---|
| 6,496,193 B1 | 12/2002 | Surti et al. | 345/552 |
| 6,496,909 B1 | 12/2002 | Schimmel | 711/163 |
| 6,501,471 B1 | 12/2002 | Venkataraman et al. | 345/424 |
| 6,502,161 B1 | 12/2002 | Perego et al. | 711/5 |
| 6,505,287 B2 | 1/2003 | Uematsu | 711/170 |
| 6,523,092 B1 | 2/2003 | Fanning | 711/134 |
| 6,523,093 B1 | 2/2003 | Bogin et al. | 711/137 |
| 6,526,483 B1 | 2/2003 | Cho et al. | 711/154 |
| 6,526,498 B1 | 2/2003 | Mirsky et al. | 712/11 |
| 6,539,490 B1 | 3/2003 | Forbes et al. | 713/401 |
| 6,552,564 B1 | 4/2003 | Forbes et al. | 326/30 |
| 6,553,476 B1 | 4/2003 | Ayaki et al. | 711/204 |
| 6,553,479 B2 | 4/2003 | Mirsky et al. | 712/16 |
| 6,587,912 B2 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,615,325 B2 | 9/2003 | Mailloux et al. | 711/154 |
| 6,622,227 B2 | 9/2003 | Zumkehr et al. | 711/167 |
| 6,628,294 B1 | 9/2003 | Sadowsky et al. | 345/568 |
| 6,629,220 B1 | 9/2003 | Dyer | 711/158 |
| 6,631,440 B2 | 10/2003 | Jenne et al. | 711/105 |
| 6,633,959 B2 | 10/2003 | Arimilli et al. | 711/141 |
| 6,636,110 B1 | 10/2003 | Ooishi et al. | 327/565 |
| 6,646,929 B1 | 11/2003 | Moss et al. | 365/194 |
| 6,647,470 B1 | 11/2003 | Janzen | 711/154 |
| 6,658,509 B1 | 12/2003 | Bonella et al. | 710/100 |
| 6,662,304 B2 | 12/2003 | Keeth et al. | 713/400 |
| 6,665,202 B2 | 12/2003 | Lindahl et al. | 365/49 |
| 6,667,895 B2 | 12/2003 | Jang et al. | 365/63 |
| 6,681,292 B2 | 1/2004 | Creta et al. | 711/119 |
| 6,681,302 B2 | 1/2004 | Cho et al. | 711/154 |
| 6,697,926 B2 | 2/2004 | Johnson et al. | 711/167 |
| 6,704,817 B1 | 3/2004 | Steinman et al. | 710/100 |
| 6,715,018 B2 | 3/2004 | Farnworth et al. | 710/300 |
| 6,718,440 B2 | 4/2004 | Maiyuran et al. | 711/137 |
| 6,721,195 B2 | 4/2004 | Brunelle et al. | 365/63 |
| 6,724,685 B2 | 4/2004 | Braun et al. | 365/233 |
| 6,728,800 B1 | 4/2004 | Lee et al. | 710/54 |
| 6,731,548 B2 | 5/2004 | Pax | 365/189.12 |
| 6,735,679 B1 | 5/2004 | Herbst et al. | 711/167 |
| 6,735,682 B2 | 5/2004 | Segelken et al. | 711/220 |
| 6,745,275 B2 | 6/2004 | Chang | 710/305 |
| 6,751,703 B2 | 6/2004 | Chilton | 711/113 |
| 6,751,722 B2 | 6/2004 | Mirsky et al. | 712/15 |
| 6,754,117 B2 | 6/2004 | Jeddeloh | 365/201 |
| 6,754,812 B1 | 6/2004 | Abdallah et al. | 712/234 |
| 6,756,661 B2 | 6/2004 | Tsuneda et al. | 257/673 |
| 6,760,833 B1 | 7/2004 | Dowling | 712/34 |
| 6,771,538 B2 | 8/2004 | Shukuri et al. | 365/185.05 |
| 6,772,295 B2 | 8/2004 | Spencer et al. | 711/137 |
| 6,775,747 B2 | 8/2004 | Venkatraman | 711/137 |
| 6,782,466 B1 | 8/2004 | Steele et al. | 711/209 |
| 6,785,780 B1 | 8/2004 | Klein et al. | 711/148 |
| 6,788,104 B2 | 9/2004 | Singh et al. | 326/39 |
| 6,789,173 B1 | 9/2004 | Tanaka et al. | 711/147 |
| 6,792,059 B2 | 9/2004 | Yuan et al. | 375/354 |
| 6,792,496 B2 | 9/2004 | Aboulenein et al. | 710/306 |
| 6,795,899 B2 | 9/2004 | Dodd et al. | 711/137 |
| 6,799,246 B1 | 9/2004 | Wise et al. | 711/117 |
| 6,799,268 B1 | 9/2004 | Boggs et al. | 712/228 |
| 6,804,760 B2 | 10/2004 | Wiliams | 711/170 |
| 6,804,764 B2 | 10/2004 | LaBerge et al. | 711/170 |
| 6,807,630 B2 | 10/2004 | Lay et al. | 713/2 |
| 6,811,320 B1 | 11/2004 | Abbott | 385/58 |
| 6,816,947 B1 | 11/2004 | Huffman | 711/151 |
| 6,820,181 B2 | 11/2004 | Jeddeloh et al. | 711/169 |
| 6,821,029 B1 | 11/2004 | Grung et al. | 385/92 |
| 6,829,705 B2 | 12/2004 | Smith | 713/1 |
| 6,845,409 B1 | 1/2005 | Talagala et al. | 710/20 |
| 6,889,304 B2 | 5/2005 | Perego et al. | 711/170 |
| 6,928,528 B1 | 8/2005 | Hewitt | 711/156 |
| 6,941,433 B1 | 9/2005 | Libby et al. | 711/167 |
| 6,980,042 B2 | 12/2005 | LaBerge | 327/291 |
| 7,047,351 B2 | 5/2006 | Jeddeloh | 711/5 |
| 7,254,075 B2 | 8/2007 | Woo et al. | 365/207 |
| 7,318,130 B2 | 1/2008 | Morrow et al. | 711/154 |
| 2001/0039612 A1 | 11/2001 | Lee | 713/2 |
| 2002/0002656 A1 | 1/2002 | Honma et al. | 711/122 |
| 2002/0112119 A1 | 8/2002 | Halbert et al. | 711/115 |
| 2002/0116588 A1 | 8/2002 | Beckert et al. | 711/161 |
| 2002/0120709 A1 | 8/2002 | Chow et al. | 709/213 |
| 2002/0144064 A1 | 10/2002 | Fanning | 711/144 |
| 2002/0178319 A1 | 11/2002 | Sanchez-Olea | 710/305 |
| 2003/0005223 A1 | 1/2003 | Coulson et al. | 711/118 |
| 2003/0014578 A1 | 1/2003 | Pax | 710/100 |
| 2003/0043158 A1 | 3/2003 | Wasserman et al. | 345/545 |
| 2003/0043426 A1 | 3/2003 | Baker et al. | 359/109 |
| 2003/0093630 A1 | 5/2003 | Richard et al. | 711/154 |
| 2003/0149809 A1 | 8/2003 | Jensen et al. | 710/22 |
| 2003/0156639 A1 | 8/2003 | Liang | 375/240.01 |
| 2003/0163649 A1 | 8/2003 | Kapur et al. | 711/146 |
| 2003/0177320 A1 | 9/2003 | Sah et al. | 711/158 |
| 2003/0193927 A1 | 10/2003 | Hronik | 370/351 |
| 2003/0223295 A1 | 12/2003 | Ozguz et al. | 365/201 |
| 2003/0229762 A1 | 12/2003 | Maiyuran et al. | 711/137 |
| 2003/0229770 A1 | 12/2003 | Jeddeloh | 711/213 |
| 2004/0006671 A1 | 1/2004 | Hangden et al. | 711/137 |
| 2004/0015666 A1 | 1/2004 | Rojas et al. | 711/159 |
| 2004/0019728 A1 | 1/2004 | Sharma | 710/306 |
| 2004/0022094 A1 | 2/2004 | Radhakrishnan et al. | 365/200 |
| 2004/0024978 A1 | 2/2004 | Jeddeloh | 711/154 |
| 2004/0034753 A1 | 2/2004 | Jeddeloh | 711/163 |
| 2004/0039886 A1 | 2/2004 | Christofferson et al. | 711/156 |
| 2004/0049649 A1 | 3/2004 | Durrant | 711/165 |
| 2004/0064602 A1 | 4/2004 | George | 710/22 |
| 2004/0122988 A1 | 6/2004 | Han et al. | 710/5 |
| 2004/0126115 A1 | 7/2004 | Levy et al. | 398/116 |
| 2004/0144034 A1 | 7/2004 | Lee et al. | 257/200 |
| 2004/0158677 A1 | 8/2004 | Dodd | 711/118 |
| 2004/0170196 A1 | 9/2004 | Susnow | 370/503 |
| 2004/0236885 A1 | 11/2004 | Fredriksson et al. | 710/100 |
| 2004/0260864 A1 | 12/2004 | Lee et al. | 711/101 |
| 2004/0260909 A1 | 12/2004 | Lee et al. | 711/213 |
| 2004/0268061 A1 | 12/2004 | Khare et al. | 711/151 |
| 2005/0060533 A1 | 3/2005 | Woo et al. | 713/100 |
| 2005/0066137 A1 | 3/2005 | Jeddeloh et al. | 711/154 |
| 2005/0071542 A1 | 3/2005 | Weber et al. | 711/105 |
| 2005/0078506 A1 | 4/2005 | Rao et al. | 365/154 |
| 2005/0105350 A1 | 5/2005 | Zimmerman | 365/201 |
| 2005/0149774 A1 | 7/2005 | Jeddeloh et al. | 713/500 |
| 2005/0172084 A1 | 8/2005 | Jeddeloh | 711/154 |
| 2005/0216648 A1 | 9/2005 | Jeddeloh | 710/311 |
| 2005/0216678 A1 | 9/2005 | Jeddeloh | 711/154 |
| 2005/0223161 A1 | 10/2005 | Jeddeloh | 711/105 |
| 2005/0228939 A1 | 10/2005 | Janzen | 711/105 |
| 2005/0246558 A1 | 11/2005 | Ku | 713/300 |
| 2005/0257005 A1 | 11/2005 | Jeddeloh | 711/115 |
| 2005/0286506 A1 | 12/2005 | LaBerge | 370/363 |
| 2006/0085616 A1 | 4/2006 | Zeighami et al. | 711/167 |
| 2006/0288172 A1 | 12/2006 | Lee et al. | 711/137 |
| 2007/0011392 A1 | 1/2007 | Lee et al. | 711/5 |
| 2007/0033353 A1 | 2/2007 | Jeddeloh | 711/154 |
| 2007/0113027 A1 | 5/2007 | Jeddeloh | 711/154 |

FOREIGN PATENT DOCUMENTS

| | | |
|---|---|---|
| JP | 06-004401 | 1/1994 |
| JP | 06-028180 | 2/1994 |
| JP | 08-185383 | 7/1996 |
| JP | 10-228413 | 8/1998 |
| JP | 2001265539 A | 9/2001 |
| WO | WO 93/19422 | 9/1993 |
| WO | 97-04401 | 2/1997 |
| WO | 99-23570 | 5/1999 |

| | | |
|---|---|---|
| WO | 99-34294 | 7/1999 |
| WO | 00-43902 | 7/2000 |
| WO | WO 02/27499 A2 | 4/2002 |

OTHER PUBLICATIONS

Intel, "Flash Memory PCI Add-In Card for Embedded Systems", Application Note AP-758, Sep. 1997, pp. i-13.

Intel, "Intel 840 Chipset: 82840 Memory Controller Hub (MCH)", Datasheet, www.intel.com/design/chipsets/datashts/298020.htm, Oct. 1999, pp. 1-178.

Micron Technology, Inc., "Synchronous DRAM Module 512MB/1GB (x72, ECC) 168-PIN Registered FBGA SDRAM DIMM", Micron Technology, Inc., 2002, pp. 1-23.

Shanley, T. et al., "PCI System Architecture", Third Edition, Mindshare, Inc., 1995, pp. 24-25.

Hellwagner, Hermann et al., *"Enabling a PC Cluster for High-Performance Computing"*, The SPEEDUP Journal, vol. 11, No. 1, Jun. 1997, pp. 1-9.

MEMORY MODULES HAVING A MEMORY HUB CONTAINING A POSTED WRITE BUFFER, A MEMORY DEVICE INTERFACE AND A LINK INTERFACE, AND METHOD OF POSTING WRITE REQUESTS IN MEMORY MODULES

CROSS-REFERENCE TO RELATED APPLICATION

This application is a continuation of U.S. Pat. application Ser. No. 10/601,253, filed Jun. 20, 2003, now U.S. Pat. No. 7,107,415, issued on Sept. 12, 2006.

TECHNICAL FIELD

This invention relates to computer systems, and, more particularly, to a computer system having a processor or other memory access device coupled to a plurality of memory modules each of which includes a memory hub coupled to a plurality of memory devices.

BACKGROUND OF THE INVENTION

Computer systems use memory devices, such as dynamic random access memory ("DRAM") devices, to store data that are accessed by a processor. These memory devices are normally used as system memory in a computer system. In a typical computer system, the processor communicates with the system memory through a processor bus and a memory controller. The processor issues a memory request, which includes a memory command, such as a read command, and an address designating the location from which data or instructions are to be read. The memory controller uses the command and address to generate appropriate command signals as well as row and column addresses, which are applied to the system memory. In response to the commands and addresses, data are transferred between the system memory and the processor. The memory controller is often part of a system controller, which also includes bus bridge circuitry for coupling the processor bus to an expansion bus, such as a PCI bus.

Although the operating speed of memory devices has continuously increased, this increase in operating speed has not kept pace with increases in the operating speed of processors. Even slower has been the increase in operating speed of memory controllers coupling processors to memory devices. The relatively slow speed of memory controllers and memory devices limits the data bandwidth between the processor and the memory devices.

In addition to the limited bandwidth between processors and system memory devices, the performance of computer systems is also limited by latency problems that increase the time required to read data from system memory devices. More specifically, when a memory device read command is coupled to a system memory device, such as a synchronous DRAM ("SDRAM") device, the read data are output from the SDRAM device only after a delay of several clock periods. Therefore, although SDRAM devices can synchronously output burst data at a high data rate, the delay in initially providing the data can significantly slow the operating speed of a computer system using such SDRAM devices as system memory.

Memory read latency may also be adversely impacted by the need to write data to memory devices. More specifically, if a controller issues a write request followed by a read request, it may not be possible for a memory device to which the requests are issued to respond to the read request until after the write request has been serviced. The memory read latency will therefore be increased by the time required to service the write request. Therefore, write requests can considerably increase memory read latencies.

One approach to limiting the degree to which write requests can increase memory read latency is to use posted write buffers to store write requests while a read request is being serviced. In a computer system having a posted write buffer, the processor or other memory access device can issue a write request even if the memory device to which the write request is directed is busy servicing a prior write or read request. Using this approach, memory requests can be serviced out of order since an earlier write request can be stored in the posted write buffer while a subsequent read request is being serviced. The ability to buffer write requests to allow a read request to be serviced can greatly reduce memory read latency since read requests can be given first priority regardless of their chronological order.

The use of a posted write buffer can provide advantages in addition to reducing memory read latency. For example, a series of write requests interspersed with read requests can be stored in the posted write buffer to allow the read requests to be serviced in a pipelined manner followed by servicing the stored write requests in a pipelined manner. Accumulating write requests in this manner also tends to avoid placing alternating write and read requests on a memory bus, which can require that lengthy settling times be provided between coupling the write request to the memory device and subsequently coupling the read request to the memory device.

Although the use of posted write buffers provides significant advantages in conventional computer systems, it is likely to be less advantageous in a computer system having a memory system using a hub architecture. In a conventional computer system, the posted write buffer is normally a part of the system controller or the processor. A posted write buffer in the processor or controller can adequately handle the write requests that a processor issues to several memory devices. In a hub architecture, a processor is coupled to several memory modules through a system controller or similar device. Each of the memory modules includes a memory hub coupled to the controller and to several memory devices that are also part of the memory module. A posted write buffer located in the controller is likely to be inadequate in handling the vastly higher rate of write requests that would be directed to several memory modules each of which includes a memory hub coupled to several memory devices. Not only is the bandwidth that the posted write buffer would be required to handle vastly greater with a hub architecture, but the difficulty in ensuring write buffer coherency is also vaster greater. More specifically, the posted write buffer must be able to handle a "read around write" situation in which a read request to a memory address is processed prior to an earlier occurring write request to the same memory address. Otherwise, the read request will return the wrong data because the write request, which would have stored the correct data at that memory address, has not yet been serviced. The large amount of write requests that would need to be buffered with a hub architecture in a system having a large number of memory addresses would make it very difficult to ensure coherency in conventional posted write buffers.

There is therefore a need for an architecture that provides the advantages of a posted write buffer in a computer system or other electronic system using a memory hub architecture, thereby providing a memory system having a high bandwidth and low latency.

SUMMARY OF THE INVENTION

A memory module that may be used in a computer system includes a memory hub coupled to a plurality of memory devices The memory hub includes a link interface receiving memory requests for access to at least one of the memory devices, and a memory device interface coupled to the memory devices. The memory device interface couples memory requests to the memory devices for access to at least one of the memory devices and receives read data responsive to at least some of the memory requests. The memory hub also includes a posted write buffer coupled to the link interface and the memory device interface. The posted write buffer stores write memory requests and subsequently couples the write memory requests to the memory device interface. A read request path in the memory hub, which may include a memory sequencer, couples read memory requests from the link interface to the memory device interface and couples read data from the memory device interface to the link interface. The posted write buffer may also include coherency circuitry for determining if a read request is directed to an address to which a write request has been posted. If so, the read data responsive to the read request is provided from the posted write buffer rather from one of the memory devices.

DETAILED DESCRIPTION OF THE INVENTION

Figure 1:
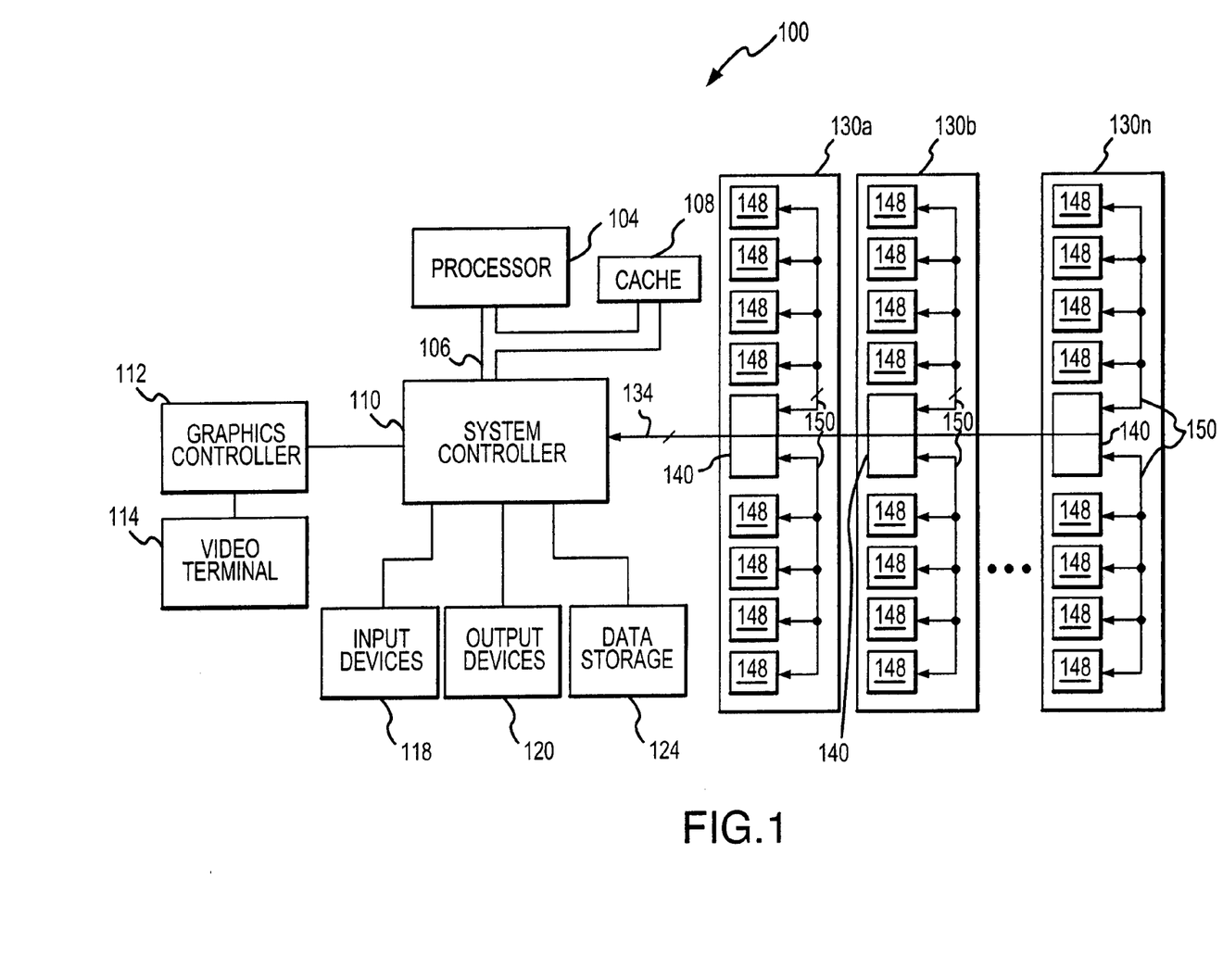
FIG. 1 is a block diagram of a computer system according to one example of the invention in which a memory hub is included in each of a plurality of memory modules.

A computer system 100 according to one example of the invention is shown in FIG. 1. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, as previously mentioned, is usually static random access memory ("SRAM"). Finally, the processor bus 106 is coupled to a system controller 110, which is also sometimes referred to as a "North Bridge" or "memory controller."

The system controller 110 serves as a communications path to the processor 104 for a variety of other components. More specifically, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 is coupled to several memory modules 130a,b . . . n, which serve as system memory for the computer system 100. The memory modules 130 are preferably coupled to the system controller 110 through a high-speed link 134, which may be an optical or electrical communication path or some other type of communications path. In the event the high-speed link 134 is implemented as an optical communication path, the optical communication path may be in the form of one or more optical fibers, for example. In such case, the system controller 110 and the memory modules will include an optical input/output port or separate input and output ports coupled to the optical communication path. The memory modules 130 are shown coupled to the system controller 110 in a multi-drop arrangement in which the single high-speed link 134 is coupled to all of the memory modules 130. However, it will be understood that other topologies may also be used, such as a point-to-point coupling arrangement in which a separate high-speed link (not shown) is used to couple each of the memory modules 130 to the system controller 110. A switching topology may also be used in which the system controller 110 is selectively coupled to each of the memory modules 130 through a switch (not shown). Other topologies that may be used will be apparent to one skilled in the art.

Figure 2:
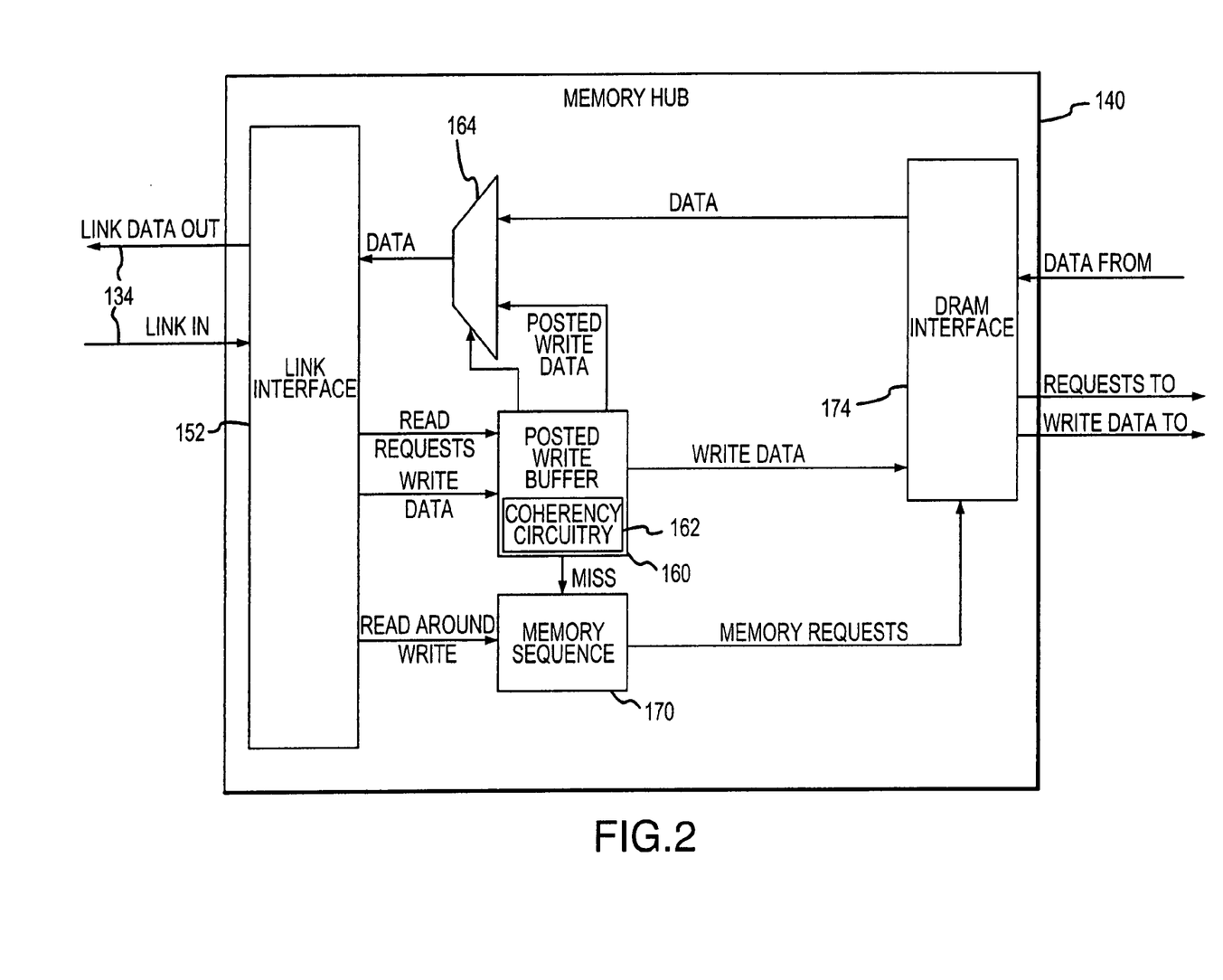
FIG. 2 is a block diagram of a memory hub used in the computer system of FIG. 1, which contains a posted write buffer according to one example of the invention.

Each of the memory modules 130 includes a memory hub 140 for controlling access to 6 memory devices 148, which, in the example illustrated in FIG. 2, are synchronous dynamic random access memory ("SDRAM") devices. However, a fewer or greater number of memory devices 148 may be used, and memory devices other than SDRAM devices may, of course, also be used. The memory hub 140 is coupled to each of the system memory devices 148 through a bus system 150, which normally includes a control bus, an address bus and a data bus.

One example of the memory hub 140 of FIG. 1 is shown in FIG. 2. The memory hub 140 includes a link interface 152 that is coupled to the high-speed link 134. The nature of the link interface 152 will depend upon the characteristics of the high-speed link 134. For example, in the event the high-speed link 134 is implemented using an optical communications path, the link interface 152 will include an optical input/output port or separate input and output ports and will convert optical signals received through the optical communications path into electrical signals and electrical signals into optical signals that are transmitted to the optical communications path. In any case, the link interface 152 may include a variety of conventional interface circuitry such as, for example, a first-in, first-out buffer (not shown), for receiving and storing memory requests as they are received through the high-speed link 134. The memory requests can then be stored in the link interface until they can be processed by the memory hub 140.

A memory request received by the link interface 152 is processed by first transferring the request to a posted write buffer 160. If the memory request is a write request, the request will be stored for subsequent processing, as explained in greater detail below. If the memory request is a read request, conventional coherency circuitry 162 in the posted write buffer 160 checks to determine if the read request is to an address to which a previous write request still stored in the buffer is directed. For example, the coherency circuitry can 162 post write request addresses to a posted address buffer.

The address forming part of each read request can then be compared to the addresses in the posted address buffer.

In the event of an address match, the read data called for by the read request are returned from the posted write buffer 160. The posted write data are coupled from the posted write buffer 160 to one port of a multiplexer 164. The coherency circuitry 162 in the posted write buffer 160 also applies a control signal to the multiplexer 164 to couple the posted write data to the link interface 152. In the coherency circuitry 162 does not detect an event match, the posted write buffer 160 applies an active high MISS signal to a memory sequencer 170, which receives the read request from the link interface 152 as "Read Around Write" request. The memory sequencer 170 responds to the MISS signal by placing the read request in the proper sequence with other read requests and subsequently coupling the read request to a memory device interface 174. The memory sequencer 170 may also convert the read requests from the format output from the system controller 110 (FIG. 1) into a read request having a format that can be used by the memory devices 148. These re-formatted request signals will normally include memory command signals, which are derived from memory commands contained in the memory request received by the memory hub 140, and row and column address signals, which are derived from an address contained in the memory request received by the memory hub 140. For example, where the memory devices 148 are conventional DRAM devices, the memory sequencer 170 will output row address signals, a row address strobe ("RAS") signal, an active low write/active low read signal ("W/R*"), column address signals and a column address strobe ("CAS") signal. The re-formatted memory requests are preferably output from the memory sequencer 170 in the order they will be used by the memory devices 148.

After the memory device interface 174 has applied the read request to the memory devices 148, the memory devices 148 return read data called for by the request to the memory device interface 174. The memory device interface 174 then couples the read data to the other input port of the multiplexer 164. If the posted write buffer 160 outputs an inactive low MISS signal, it also couples a control signal to the multiplexer 164 that causes the read data from the memory device interface 174 to be coupled to the link interface 152. The link interface 152 then couples the read data to the controller 110 through the high-speed link 134.

As an alternative to reading from the posted write buffer 160 in the event its internal coherency circuitry 162 detects a match between a memory read address and a posted write address, the coherency circuit 162 may instead cause the read request to be delayed and immediately issue the posted write request to write data to the memory devices 148. The memory hub 140 can then issue the read request to the memory devices 148 to read the data that has now been written to the memory devices 148 at the memory read address. Other means of ensuring coherency that may be used in the event a read request is serviced before servicing a write request to the same address will be apparent to one skilled in the art.

As mentioned above, the memory sequencer 170 applies the read around write memory requests to the memory device interface 174. The nature of the memory device interface 174 will again depend upon the characteristics of the memory devices 148. In any case, the memory device interface 174, like the link interface 152, may include a FIFO buffer (not shown), for receiving and storing one or more memory requests as they are received from the link interface 152. The memory request can be stored in the FIFO buffer until they can be processed by the memory devices 148. Alternatively, the memory device interface 174 can simply pass the memory requests to the memory devices 148. In the event the memory device interface 174 stores several memory requests until they can be processed by the memory devices 148, the memory device interface 174 may re-order the memory requests so that they are applied to the memory devices 148 in some other order.

At some point during the operation of the memory hub 140, write requests posted in the buffer 160 will accumulate to a level that they must be serviced. Various techniques for controlling the level of posted write requests that can accumulate will be discussed below. In any case, when the posted write requests have accumulated to a sufficient level, the posted write buffer 160 couples the write requests to the memory device interface 174. These write requests will normally include the write data as well as the address to which that data are to be written and appropriate command signals, as are well known to one skilled in the art. The memory device interface 174 then passes the write requests on to the memory device 148 addressed by the write request.

Figure 3:
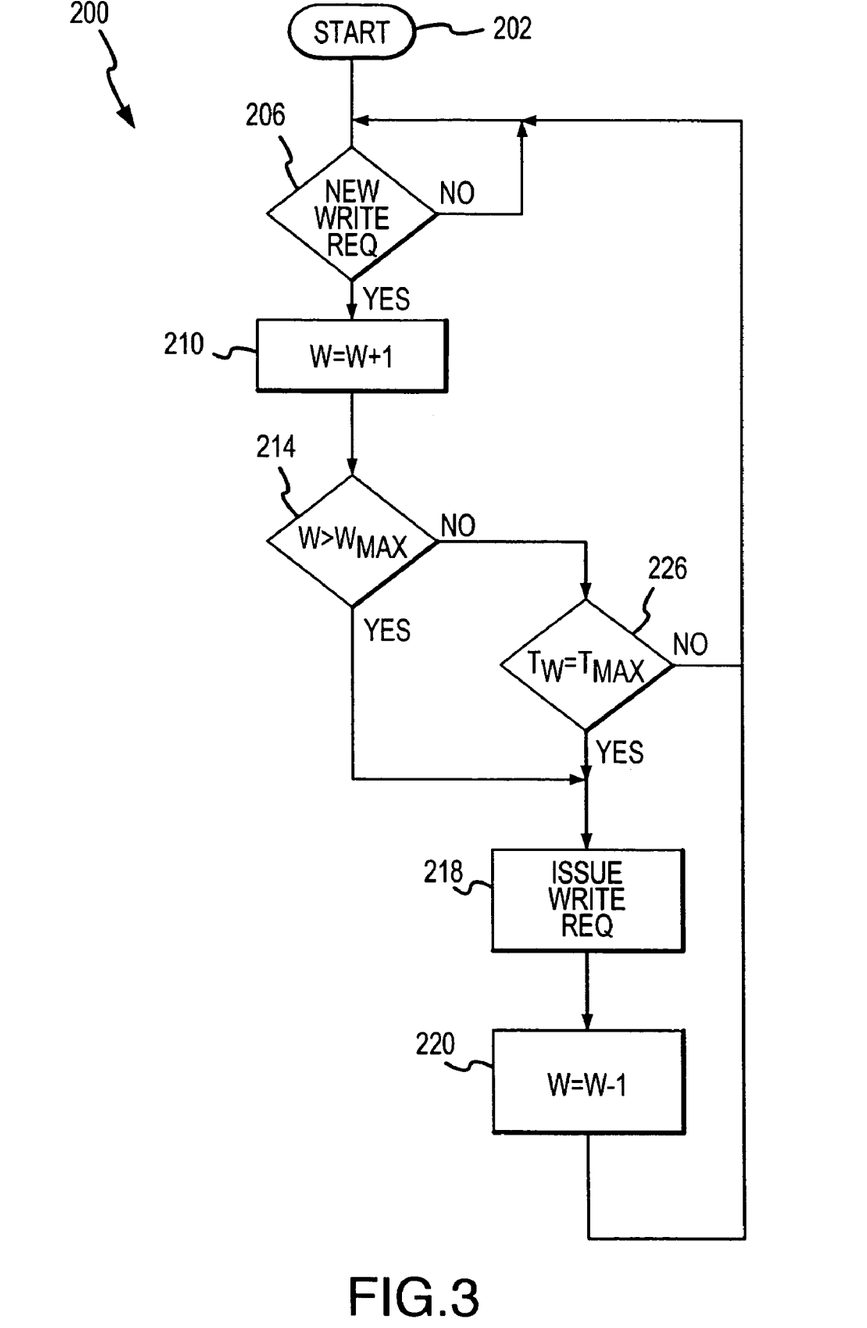
FIG. 3 is a flow chart showing a process for controlling the number of posted write requests that have been accumulated in a posted write buffer in the memory hub shown in FIG. 2.

The accumulation of posted write requests in the buffer 160 may be controlled by the process 200 shown in FIG. 3. The process 200 is entered at 202 and waits at 206 for a new write request to be received from the link interface 152. When a new write request is received from the link interface 152, a counter keeping track of the number W of posted write requests accumulated in the posted write buffer 160 is incremented at 210. The process then checks at 214 to determine if the number of posted write requests W accumulated exceeds a maximum number, $W_{MAX}$. If W exceeds $W_{MAX}$, the posted write buffer 160 couples a write request to the memory device interface 174 at 218. The posted write buffer 160 can issue the write requests in any desired order, such as on a first-in, first-out order, a first-in, last-out order or some or other order, as is well known to one skilled in the art. In any case, once the posted write buffer 160 has issued the write request, the number of of posted write requests W accumulated is-decremented by one at 220. The process then returns to 206 to await another write request.

Using the procedure 200 described above, the posted write buffer 160 will issue write requests only when $W_{MAX}$ write requests have been accumulated in the buffer 160 until the number of write requests posted in the buffer 160 falls to some predetermined number which may be zero. Under these circumstances, the posted write buffer 160 would never issue the final $W_{MAX}$ write requests. For this reason, if the process 200 determines at 214 that W does not exceed $W_{MAX}$, the process 200 checks at 226 to determine if the time $T_W$ any write request has remained in the posted write buffer 160 exceeds a maximum time $T_{MAX}$. If so, the process 200 branches to 218 to issue the overdue write requests, as previously explained. Otherwise, the process returns to 206 to await a new write request.

Although a specific example of a technique for controlling the accumulation of posted write requests has been explained with reference to FIG. 3, it will be apparent to one skilled in the art than other techniques may be used. For example, posted write requests could be issued by the buffer 160 after they had remained there for a predetermined period of time regardless of how many write requests had been accumulated. The posted write buffer 160 can also issue the posted write requests whenever read requests are not being processed by the memory hub 140 or the memory devices 148 coupled thereto. Also, the values $W_{MAX}$ and $T_{MAX}$ may be adjusted depending on various operating conditions. For example, the maximum number of posted write requests accumulated $W_{MAX}$ could be adjusted depending upon the rate at which posted write requests are being accumulated. Other variations will be apparent to one skilled in the art.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A memory system, comprising:
a controller having an input port and an output port;
a plurality of memory modules, each of the memory modules comprising:
  a plurality of memory devices; and
  a memory hub, comprising:
    a link interface receiving memory requests for access to at least one of the memory devices;
    a memory device interface coupled to the memory devices, the memory device interface being operable to transmit memory requests to the memory devices for access to at least one of the memory devices and to receive read data responsive to at least some of the memory requests;
    a posted write buffer coupled to the link interface and the memory device interface, the posted write buffer being operable to store write memory requests and to subsequently transmit the write memory requests to the memory device interface; and
    a read request path operable to transmit read memory requests from the link interface to the memory device interface and to transmit read data from the memory device interface to the link interface; and
  a communications link coupled between the system controller and each of the memory modules for transmitting memory requests and read data between the system controller and the memory modules in the respective memory modules.

2. The computer system of claim 1 wherein the read request path comprises a memory sequencer coupled to the link interface and the memory device interface, the memory sequencer being operable to transmit memory requests to the memory device interface responsive to memory requests received from the link interface.

3. The computer system of claim 1 wherein the posted write buffer comprises coherency circuitry that is operable to receive read memory requests from the link interface and is operable to determine if read data called for by the read request is stored in the posted write buffer and to generate a hit signal responsive thereto, and wherein the memory sequencer is coupled to receive the hit signal from the posted write buffer and is operable to transmit memory requests to the memory device interface responsive to memory requests received from the link interface only in the absence of the hit signal.

4. The computer system of claim 1 wherein the posted write buffer is operable to transmit the write memory requests to the memory device interface only when neither the memory hub nor the memory devices are busy servicing read memory requests.

5. The computer system of claim 1 wherein the posted write buffer further comprises coherency circuitry coupled to receive read memory requests from the link interface, the coherency circuitry being operable to determine from each read memory request whether the read memory request is directed to a memory address to which a write memory request has been stored in the posted write buffer and has not yet been coupled to the memory device interface, the coherency circuitry being operable to transmit the read data responsive to the read memory request from the posted write buffer to the link interface in the event the read memory request is directed to a memory address to which a write memory request has been stored in the posted write buffer and has not yet been coupled to the memory device interface.

6. The computer system of claim 1 wherein the memory hub further comprises a multiplexer having a first input port coupled to receive read data from the posted write buffer, a second input port coupled to receive read data from the memory device interface and an output port coupled to the link interface to apply read data to the link interface, the multiplexer further having a control terminal coupled to the posted write buffer, the posted write buffer generating a control signal to cause the multiplexer to couple the output port to the first input port in the event the read memory request is directed to a memory address to which a write memory request has been stored in the posted write buffer and has not yet been coupled to the memory device interface, and to generate a control signal to cause the multiplexer to couple the output port to the second input port in the event the read memory request is not directed to a memory address to which a write memory request has been stored in the posted write buffer and has not yet been coupled to the memory device interface.

7. The computer system of claim 1 wherein the posted write buffer is operable to store posted write memory requests until the number of posted write memory requests accumulated exceeds a predetermined number, and to thereafter transmit the posted write memory requests to the memory device interface.

8. The computer system of claim 1 wherein the posted write buffer is operable to store posted write memory requests until the posted write memory requests have been stored for more than a predetermined duration, and to thereafter transmit the posted write memory requests to the memory device interface.

9. The computer system of claim 1 wherein the posted write buffer is operable to store posted write memory requests as long as the number of posted write memory requests accumulated does not exceeds a predetermined number and the posted write memory requests have not been stored for more than a predetermined duration, and to transmit the posted write memory requests to the memory device interface if either the number of posted write memory requests accumulated exceeds the predetermined number or the posted write memory requests have been stored for more than the predetermined duration.

10. The computer system of claim 1 wherein the link interface comprises an optical input/output port.

* * * * *